US008616729B2

(12) United States Patent
Bak

(10) Patent No.: US 8,616,729 B2
(45) Date of Patent: *Dec. 31, 2013

(54) LENS AND LIGHT EMITTING APPARATUS HAVING THE SAME

(71) Applicant: Gyu Hyeong Bak, Seoul (KR)

(72) Inventor: Gyu Hyeong Bak, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 13/719,518

(22) Filed: Dec. 19, 2012

(65) Prior Publication Data

US 2013/0107544 A1    May 2, 2013

Related U.S. Application Data

(63) Continuation of application No. 13/531,731, filed on Jun. 25, 2012, which is a continuation of application No. 13/242,860, filed on Sep. 23, 2011, now Pat. No. 8,213,093, which is a continuation of application No. 12/875,671, filed on Sep. 3, 2010, now Pat. No. 8,052,307.

(30) Foreign Application Priority Data

Nov. 19, 2009  (KR) .................. 10-2009-0112279

(51) Int. Cl.
*H01L 33/58* (2010.01)
(52) U.S. Cl.
USPC . 362/257; 362/249.02; 362/800; 362/311.01; 362/311.02; 362/308

(58) Field of Classification Search
USPC .......... 362/257, 311.02, 311.01, 249.02, 308, 362/296.05, 311.06
See application file for complete search history.

(56) References Cited

U.S. PATENT DOCUMENTS 5,526,190 A   6/1996  Hubble et al.
5,701,207 A   12/1997 Waketa et al.
(Continued)

FOREIGN PATENT DOCUMENTS

DE       197 55 734       6/1999
DE    10 2006 018 223     5/2007
(Continued)

OTHER PUBLICATIONS

Korean Office Action dated Apr. 5, 2010 issued in Application No. 10-2009-0112279.

(Continued)

*Primary Examiner* — Anabel Ton
(74) *Attorney, Agent, or Firm* — KED & Associates, LLP

(57) ABSTRACT

Provided is a lens. The lens includes a lens body including a convex top surface having a first recessed part at a central portion thereof and a flat surface at a circumference thereof and a flat bottom surface having a second recessed part at a central portion thereof; and a plurality of lens supports on the bottom surface of the lens body, wherein a ratio of a maximum depth (a) of the first recessed part, from the top surface of the lens body to a bottom surface of the first recessed part, to a maximum thickness (h) of the lens body, from the top surface of the lens body to the bottom surface of the lens body, ranges from 0.06 to 0.1.

20 Claims, 10 Drawing Sheets

(56) References Cited

U.S. PATENT DOCUMENTS

| | | |
|---|---|---|
| 6,610,563 B1 | 8/2003 | Waitl et al. |
| 6,617,786 B1 | 9/2003 | Centafante |
| 6,670,207 B1 | 12/2003 | Roberts |
| 6,724,543 B1 | 4/2004 | Chinniah et al. |
| 6,813,096 B2 | 11/2004 | Ohta |
| 7,119,964 B2 | 10/2006 | Kim et al. |
| 7,549,781 B2 | 6/2009 | Kim et al. |
| 7,570,437 B2 | 8/2009 | Gal et al. |
| 7,602,559 B2 | 10/2009 | Jang et al. |
| 8,052,307 B2 * | 11/2011 | Bak et al. .................. 362/257 |
| 8,213,093 B2 * | 7/2012 | Bak et al. .................. 359/718 |
| 2004/0207999 A1 | 10/2004 | Suehiro et al. |
| 2004/0223315 A1 | 11/2004 | Suehiro et al. |
| 2006/0138437 A1 | 6/2006 | Huang et al. |
| 2007/0041210 A1 | 2/2007 | Ikuno et al. |
| 2007/0099316 A1 | 5/2007 | Lee et al. |
| 2008/0007966 A1 | 1/2008 | Ohkawa |
| 2008/0029775 A1 | 2/2008 | Liu et al. |
| 2008/0303757 A1 | 12/2008 | Ohkawa et al. |
| 2009/0296407 A1 | 12/2009 | Bailey |
| 2010/0195335 A1 | 8/2010 | Allen et al. |

FOREIGN PATENT DOCUMENTS

| | | |
|---|---|---|
| EP | 1 717 627 | 11/2006 |
| EP | 1 860 467 | 11/2007 |
| EP | 1 959 505 | 8/2008 |
| EP | 2 023 038 | 2/2009 |
| EP | 2 058 679 | 5/2009 |
| JP | 2006-286997 A | 10/2006 |
| JP | 2009-152142 A | 7/2009 |
| KR | 10-2007-0021873 A | 2/2007 |
| KR | 10-0706942 B1 | 4/2007 |
| KR | 10-0869573 B1 | 11/2008 |
| KR | 10-2009-0059877 A | 6/2009 |
| WO | WO 2006/103582 | 10/2006 |
| WO | WO 2007/021149 | 2/2007 |
| WO | WO 2008/104936 | 9/2008 |
| WO | WO 2009/008636 | 1/2009 |

OTHER PUBLICATIONS

Korean Notice of Allowance dated Jul. 23, 2010 issued in Application No. 10-2009-0112279.
U.S. Office Action issued in U.S. Appl. No. 12/875,671 dated May 20, 2011.
European Search Report dated Dec. 20, 2010 issued in Application No, 10 17 578.8.
EPO Communication issued in EP Application No. 10 175 788.8 dated Feb. 22, 2012.
Notice of Allowance issued in Application No. 13/242,860 dated Mar. 5, 2012.
Korean Office Action issued in Application No. 10-2009-0112479 dated Apr. 5, 2010.
Korean Notice of Allowance issued in Application No 10-2009-0112479 dated Jul. 27, 2010.
European Search Report issued in EP Application No. 10191919.9 dated Mar. 30, 2011.
U.S. Office Action issued in U.S. Appl. No. 12/949,915 dated Mar. 22, 2011.
U.S. Office Action issued in U.S. Appl. No. 12/949,915 dated Jul. 18, 2011.
U.S. Office Action issued in U.S. Appl. No. 12/949,915 dated Dec. 13, 2011.
U.S. Office Action issued in U.S. Appl. No. 12/949,915 dated Jun. 22, 2012.
European Search Report issued in EP Application No. 121814512.9 dated Oct. 22, 2012.
European Office Action issued in EP Application No. 10 175 788.8 dated Nov. 28, 2012.
U.S. Office Action issued in U.S. Appl. No. 13/759,564 dated Jun. 11, 2013.
U.S. Final Office Action issued in U.S. Appl. No. 13/759,564 dated Nov. 6, 2013.

* cited by examiner

LENS AND LIGHT EMITTING APPARATUS HAVING THE SAME

CROSS-REFERENCE TO RELATED APPLICATIONS

This application is a continuation of co-pending application Ser. No. 13/531,731 filed on Jun. 25, 2012, which is a continuation of application Ser. No. 13/242,860 filed on Sep. 23, 2011, now U.S. Pat. No. 8,213,093, which is a Continuation of application Ser. No. 12/875,671 filed on Sep. 3, 2010, now U.S. Pat. No. 8,052,307, and which claims priority to Korean Patent Application No. 10-2009-0112279, filed on Nov. 19, 2009. The entire contents of all of the above applications are hereby incorporated by reference.

BACKGROUND

The present disclosure relates to a lens and a light emitting apparatus including the lens.

Light emitting devices such as light emitting diodes have advantages of low power consumption, a long usable life cycle, and environmental friendly. Thus, the light emitting devices are being used for various light emitting apparatuses such as backlight units for electronic equipment, electronic displays, and lighting equipment.

In such a light emitting apparatus, a sealing resin layer is formed in various lens shapes to surround a light emitting device, thereby to adjust a distribution characteristic of light emitted from the light emitting device.

SUMMARY

Embodiments provide a light emitting apparatus having a novel structure.

Embodiments also provide a light emitting apparatus including a lens having a novel structure.

Embodiments also provide a light emitting apparatus having a superior light emitting characteristic in a lateral direction.

In one embodiment, a light emitting apparatus comprises: a substrate; a light emitting device package on the substrate; and a lens supported by the substrate, the lens being disposed on the light emitting device package, wherein the lens comprises a lens body comprising a first recessed part at a central portion of a top surface thereof and a second recessed part at a central portion of a bottom surface thereof and a lens support disposed on the bottom surface of the lens body to support the lens body such that the bottom surface of the lens body is spaced from the substrate.

In another embodiment, a lens comprises: a lens body having a convex top surface comprising a first recessed part at a central portion thereof and a flat surface at a circumference thereof and a flat bottom surface comprising a second recessed part at a central portion thereof; and a plurality of lens supports on the bottom surface of the lens body, wherein a ratio of a maximum depth of the first recessed part to a maximum thickness of the lens body ranges from about 0.06 to about 0.1, a ratio of a maximum depth of the second recessed part to a maximum thickness of the lens body ranges from about 0.5 to 0.75, and a ratio of a maximum depth of the second recessed part to a maximum depth of the first recessed part ranges from about 6.25 to about 10, and a ratio of a maximum width of the first recessed part to a maximum width of the lens body ranges from about 0.18 to about 0.3, a ratio of a maximum width of the second recessed part to a maximum width of the lens body ranges from about 0.14 to about 0.25, and a ratio of a maximum width of the second recessed part to a maximum width of the first recessed part ranges from about 0.7 to about 0.94.

The details of one or more embodiments are set forth in the accompanying drawings and the description below. Other features will be apparent from the description and drawings, and from the claims.

DETAILED DESCRIPTION OF THE EMBODIMENTS

Figure 1:
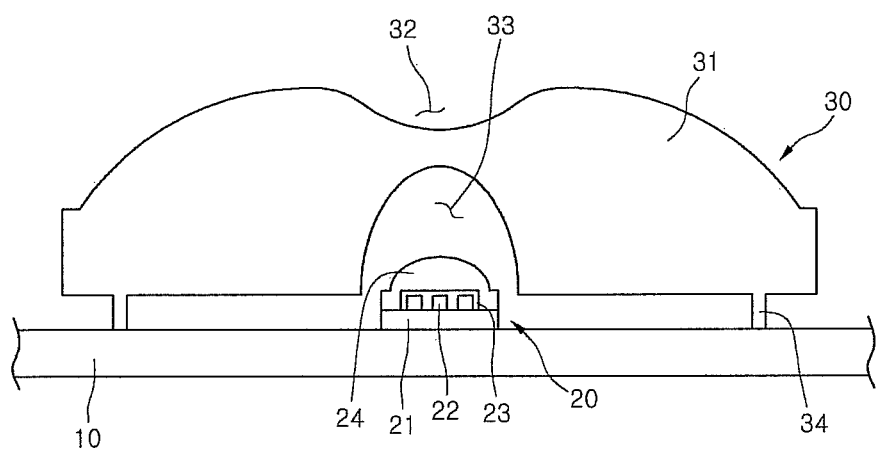
FIGS. 1 and 2 are sectional views of a light emitting apparatus according to a first embodiment.

In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'.

In the drawings, the thickness or size of each layer is exaggerated, omitted, or schematically illustrated for convenience in description and clarity. Also, the size of each element does not entirely reflect an actual size.

Figure 2:
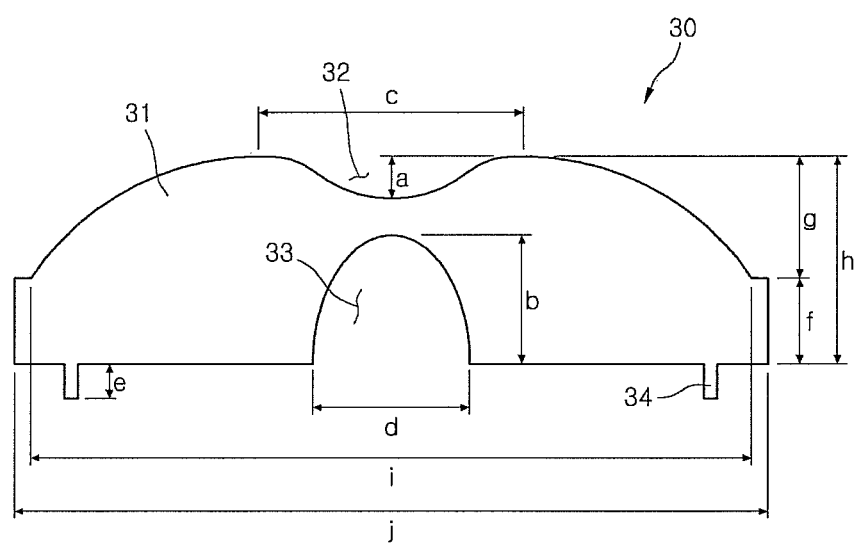

FIGS. 1 and 2 are sectional views of a light emitting apparatus according to a first embodiment.

Referring to FIGS. 1 and 2, a light emitting apparatus according to a first embodiment includes a substrate 10, a light emitting device package 20 disposed on the substrate 10, and a lens 30 disposed and supported on the substrate 10 and disposed on the light emitting device package 20.

The substrate 10 may be a printed circuit board (PCB). A circuit pattern (not shown) is disposed on the substrate 10, and the circuit pattern and the light emitting device package 20 are electrically connected to each other. Also, the substrate 10 may be a metal core printed circuit board (MCPCB).

The light emitting device package 20 includes a package body 21, at least one light emitting device 22 disposed on the package body 21, a phosphor layer 23 surrounding the light emitting device 22, and a sealing resin layer 24 surrounding the phosphor layer 23 on the package body 21.

Electrode layers (not shown) are disposed on the package body 21. The electrode layers pass through the package body 21 or disposed on a surface of the package body 21 to electrically connect the light emitting device 22 to the circuit pattern of the substrate 10. The package body 21 may be formed of various materials. For example, the package body 21 may be formed of one of a ceramic material, a resin material, and a silicon material.

The light emitting device 22 may include a light emitting diode. The light emitting device 22 may be provided in plurality on the package body 21. In this embodiment, three light emitting devices 22 are provided. The plurality of light emitting devices 22 may be connected to each other in parallel or series. Also, the plurality of light emitting devices 22 may be electrically connected to the electrode layers using a flip-chip method or a wire bonding method.

A light emitting diode emitting at least one of red light, green light, and blue light may be used as the light emitting device 22. In this embodiment, the light emitting diode emitting the blue light is illustrated as an example.

The phosphor layer 23 may surround the light emitting device 22 on the package body 21. For example, the phosphor layer 23 may contain a yellow phosphor. The phosphor layer 23 may have a flat top surface and a constant height on the package body 21.

The sealing resin layer 24 is disposed on the package body 21 to surround the phosphor layer 23. The sealing resin layer 24 may be formed of a transparent resin material, for example, an epoxy resin or a silicon resin.

The sealing resin layer 24 may protrude from a central portion of a top surface thereof. Also, the sealing resin layer 24 may be flat at a circumference of the top surface.

Although the phosphor layer 23 and the sealing resin layer 24 are separated from each other in this embodiment, the present disclosure is not limited thereto. For example, a phosphor may be dispersed into the sealing resin layer 24 on the whole without separating the phosphor layer 23 from the sealing resin layer 24.

The lens 30 includes a lens body 31 and a lens support 34 supporting the lens body 31. The lens body 31 and the lens support 34 may be integrated with each other using an injection molding. Alternatively, the lens body 31 and the lens support 34 may be provided as separate parts, and then coupled to each other using an adhesive.

The lens body 31 may have an approximately circular shape in plan view. A concavo-convex or roughness may be disposed on a bottom surface of the lens body 31. The concavo-convex or roughness may be disposed on the bottom surface of the lens body 31 except for a portion where a second recessed part 33 is formed.

The lens support 34 may be provided in plurality on the bottom surface of the lens body 31. Although only two lens supports 34 are illustrated in this embodiment, the present disclosure is not limited thereto. For example, three or more lens supports 34 may be disposed spaced from each other to stably support the lens body 31. A configuration or number of the lens support 34 may be variously modified according to its design.

The lens support 34 may have a gap between the lens body 31 and the substrate 10. Thus, air may flow through the gap to easily release heat generated in the light emitting device.

The lens support 34 may be supported by a top surface of the substrate 10. A bottom surface of the lens support 34 may contact only the top surface of the substrate 10.

Although only one lens 30 is disposed on the substrate 10 in this embodiment, a plurality of lenses may be disposed on the substrate 10.

The lens body 31 may be formed of a transparent resin material. Also, the lens body 31 may be spaced a predetermined distance from the substrate 10 by the lens support 34. The lens support 34 may be firmly attached to the substrate 10 using an adhesive.

The lens body 31 has a protruding top surface on the whole. A downwardly concave first recessed part 32 is disposed at a central portion of the top surface of the lens body 31. Also, the lens body 31 has a flat bottom surface. An upward concave second recessed part 33 is disposed at a central portion of the bottom surface of the lens body 31. The first recessed part 32 and the second recessed part 33 vertically overlap each other.

Since the first recessed part 32 and the second recessed part 33 are disposed at the central portion of the lens body 31, the lens body 31 has a thin thickness at the central portion thereof. The lens body 31 has a thickness which becomes gradually thicker from the central portion toward an edge portion and then thinner again. Also, a circumference of the top surface of the lens body 31 may be flat, and a lateral surface adjacent to the bottom surface of the lens body 31 may be perpendicular to the bottom surface of the lens body 31.

The first recessed part 32 may have a maximum depth (a) of about 0.3 mm to about 0.4 mm. The second recessed part 33 may have a maximum depth (b) of about 2.5 mm to about 3 mm. Also, the first recessed part 32 may have a maximum width (c) of about 3.5 mm to about 4 mm. The second recessed part 33 may have a maximum width (d) of about 2.8 mm to about 3 mm.

The lens support 34 may have a maximum thickness (e) of about 0.5 mm to about 0.8 mm.

The lens body 31 may have a maximum thickness (h) of about 4 mm to about 5 mm. A maximum thickness (f) from the bottom surface of the lens body 31 to the flat top surface may range from about 1.8 mm to about 2 mm. A thickness (g) from the flat top surface of the lens body 31 to a top surface may range from about 2.2 mm to about 2.8 mm.

The lens body 31 may have a maximum width (j) of about 13 mm to about 19 mm. The lens body may have a maximum width (i) of about 12 mm to about 18 mm at a portion in which the top surface of the lens body 31 is curved.

In the light emitting device package 20, the package body 21 may have a maximum thickness of about 0.3 mm to about 0.4 mm, and a maximum height from the top surface of the package body 21 to a top surface of the sealing resin layer 24 may range from about 1.1 mm to about 1.5 mm.

In this embodiment, a ratio (a/h) of the maximum depth (a) of the first recessed part 32 to the maximum thickness (h) of the lens body 31 may range from about 0.06 to about 0.1. A ratio (b/h) of the maximum depth (b) of the second recessed part 33 to the maximum thickness (h) of the lens body 31 may range from about 0.5 to 0.75. A ratio (b/a) of the maximum depth (b) of the second recessed part 33 to the maximum depth (a) of the first recessed part 32 may range from about 6.25 to about 10.

A ratio (c/j) of the maximum width (c) of the first recessed part 32 to the maximum width (j) of the lens body 31 may range from about 0.18 to about 0.3. A ratio (d/j) of the maximum width (d) of the second recessed part 33 to the maximum width (j) of the lens body 31 may range from about 0.14 to about 0.25. A ratio (d/c) of the maximum width (d) of the second recessed part 33 to the maximum width (c) of the first recessed part 32 may range from about 0.7 to about 0.94.

At least portion of the sealing resin layer 24 is disposed within the second recessed part 33. The package body 21 has the maximum thickness less than that of the lens support 34. The bottom surface of the lens body 31 may be flush with the light emitting device 22 or the phosphor layer 23 or flush with the sealing resin layer 24.

As above-described, the light emitting apparatus has superior light emitting efficiency in a lateral direction. Light emitted from the light emitting device 22 is reflected and refracted by the sealing resin layer 24 and reflected and refracted by the second recessed part 33 to emit a large amount of the light in the lateral direction. Specifically, the first recessed part 32 and the second recessed part 33 reduce an amount of light emitted in an upper direction.

Figure 9:
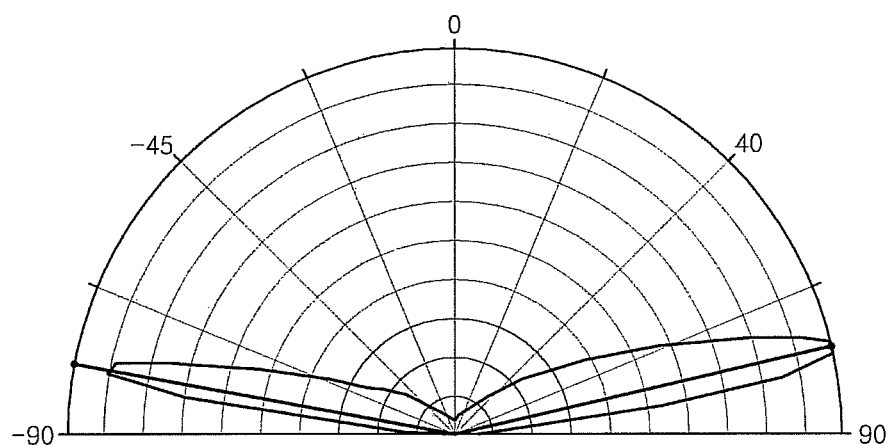
FIGS. 9 and 10 are views illustrating a light distribution characteristic of the light emitting apparatus according to the first embodiment.
Figure 10:
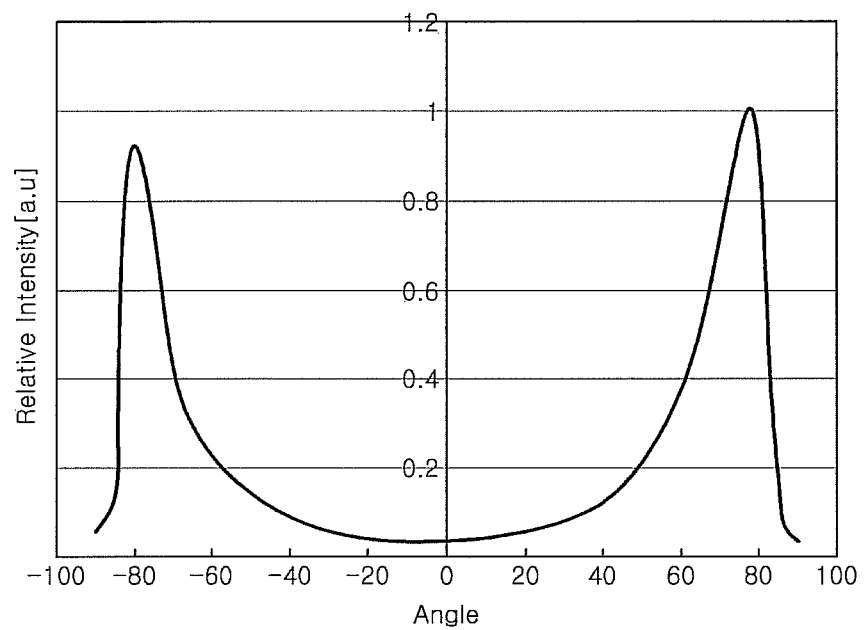

FIGS. 9 and 10 are views illustrating a light distribution characteristic of the light emitting apparatus according to the first embodiment.

Referring to FIGS. 9 and 10, the light emitting apparatus according to the first embodiment emits a peak light at an angle of about 70° to about 85° or about −70° to about −85° when an angle perpendicular to the substrate 10 is defined as 0°. That is, it may be seen that the light emitted from the light emitting apparatus is mainly emitted in the lateral direction.

Hereinafter, light emitting apparatuses according to second to seventh embodiments have light distribution characteristics similar to that of the light emitting apparatus of FIGS. 9 and 10.

Figure 3:
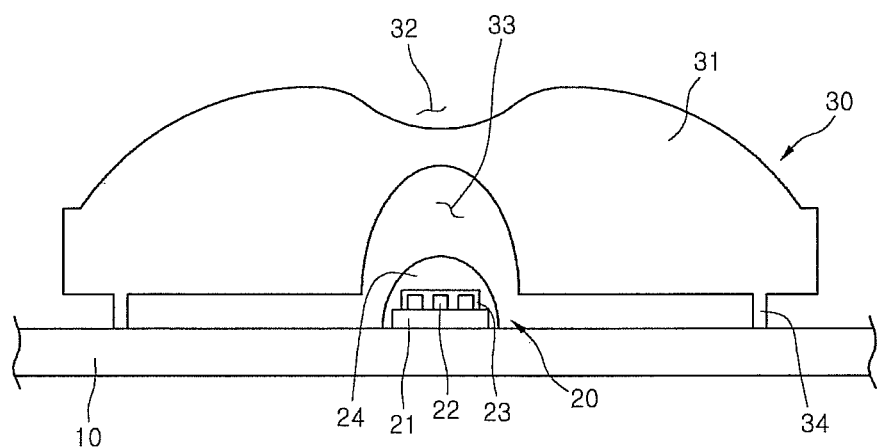
FIG. 3 is a sectional view of a light emitting apparatus according to a second embodiment.

FIG. 3 is a sectional view of a light emitting apparatus according to a second embodiment.

In descriptions of a light emitting apparatus according to a second embodiment, descriptions that duplicate those for the light emitting apparatus according to the first embodiment will be omitted.

Referring to FIG. 3, in a light emitting apparatus according to a second embodiment, a light emitting device package 20 includes a sealing resin layer 24 contacting a substrate 10. The sealing resin layer 24 is disposed on the substrate 10, a package body 21, and a phosphor layer 23. Since the sealing resin layer 24 contacts the substrate 10 and a lateral surface of the package body 21, a contact area therebetween increases. Thus, the sealing resin layer 24 may be firmly coupled.

Figure 4:
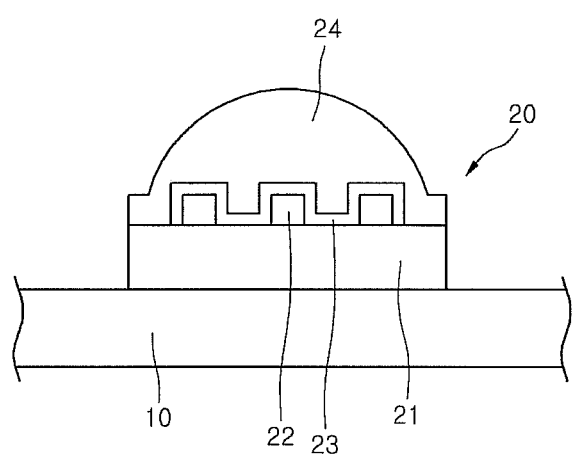
FIG. 4 is a sectional view of a light emitting device package in a light emitting apparatus according to a third embodiment.

FIG. 4 is a sectional view of a light emitting device package in a light emitting apparatus according to a third embodiment.

In descriptions of a light emitting apparatus according to a third embodiment, descriptions that duplicate those for the light emitting apparatus according to the first embodiment will be omitted.

Referring to FIG. 4, in a light emitting apparatus according to a third embodiment, a light emitting device package 20 includes a package body 21 and a phosphor layer 23 having a constant thickness on a light emitting device 22. The phosphor layer 23 may have a curved shape according to an arrangement of the light emitting device 22. That is, the phosphor layer 23 disposed on the package body 21 may have a height less than that of the phosphor layer 23 disposed on the light emitting device 22. In the light emitting apparatus according to the third embodiment, since the phosphor layer 23 surrounds the light emitting device 22 at the constant thickness, a color variation of light emitted from the light emitting apparatus may be reduced.

Figure 5:
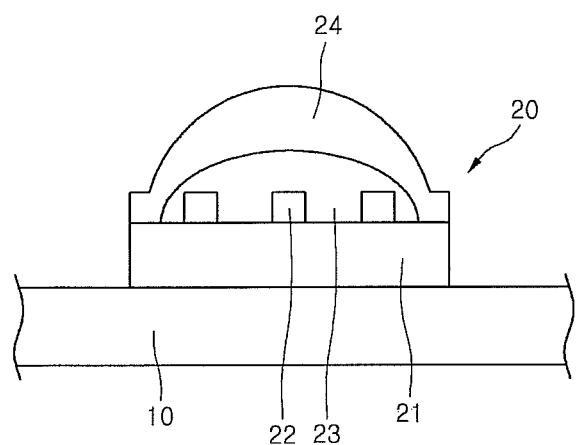
FIG. 5 is a sectional view of a light emitting device package in a light emitting apparatus according to a fourth embodiment.

FIG. 5 is a sectional view of a light emitting device package in a light emitting apparatus according to a fourth embodiment.

In descriptions of a light emitting apparatus according to a fourth embodiment, descriptions that duplicate those for the light emitting apparatus according to the first embodiment will be omitted.

Referring to FIG. 5, in a light emitting apparatus according to a fourth embodiment, a light emitting device package 20 includes a package body 21 and a phosphor layer 23 having a convex shape and disposed on a light emitting device 22.

In the light emitting apparatus according to the fourth embodiment, since the phosphor layer 23 is formed using a dispensing method, its manufacturing process is simple.

Figure 6:
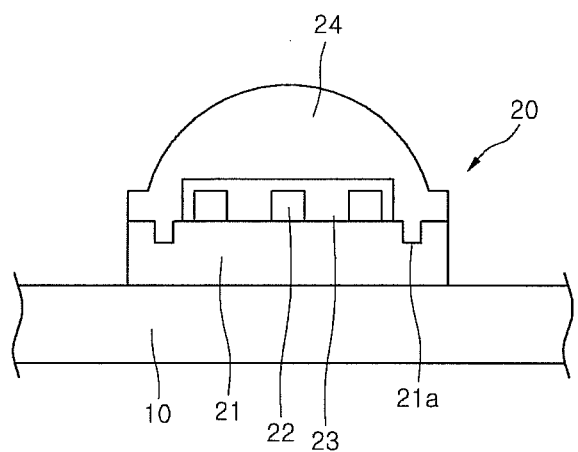
FIG. 6 is a sectional view of a light emitting device package in a light emitting apparatus according to a fifth embodiment.

FIG. 6 is a sectional view of a light emitting device package in a light emitting apparatus according to a fifth embodiment.

In descriptions of a light emitting apparatus according to a fifth embodiment, descriptions that duplicate those for the light emitting apparatus according to the first embodiment will be omitted.

Referring to FIG. 6, in a light emitting apparatus according to a fifth embodiment, a light emitting device package 20 has a groove 21a in a top surface of a package body 21. A sealing resin layer 24 is injected into the groove 21a. Thus, a contact area between the sealing resin layer 24 and the package body 21 increases to firmly couple the sealing resin layer 24 to the package body 21.

Although the groove 21a is defined in the top surface of the package body 21 in FIG. 6, the groove 21a may be defined in a lateral surface of the package body 21. Also, a protrusion instead of the groove 21a may be disposed.

Figure 7:
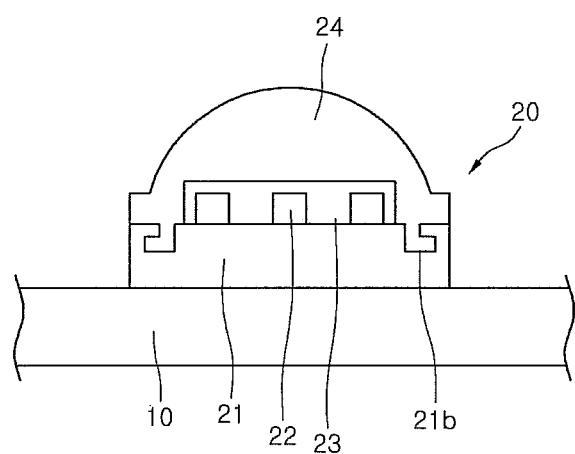
FIG. 7 is a sectional view of a light emitting device package in a light emitting apparatus according to a sixth embodiment.

FIG. 7 is a sectional view of a light emitting device package in a light emitting apparatus according to a sixth embodiment.

In descriptions of a light emitting apparatus according to a sixth embodiment, descriptions that duplicate those for the light emitting apparatus according to the first embodiment will be omitted.

Referring to FIG. 7, in a light emitting apparatus according to a sixth embodiment, a light emitting device package 20 has a double groove 21b in a top surface of the a package body 21. A sealing resin layer 24 is injected into the double groove 21b. The double groove 21b vertically extends downward from the top surface of the package body 21, and an end of the double groove 21b horizontally extends again. Thus, a contact area between the sealing resin layer 24 and the package body 21 increases. As a result, the sealing resin layer 24 within the double groove 21b serves as a hook part, the sealing resin layer 24 may be firmly coupled to the package body 21.

Figure 8:
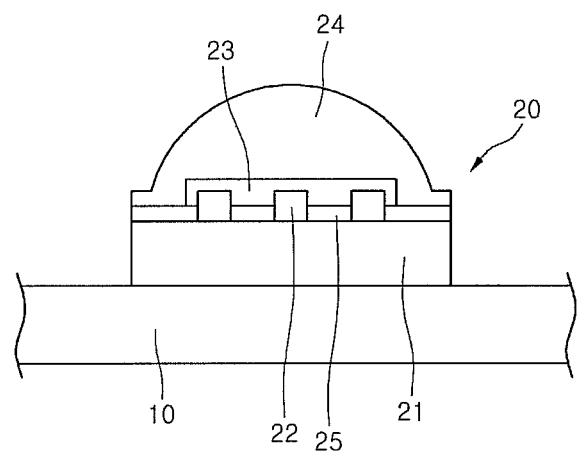
FIG. 8 is a sectional view of a light emitting device package in a light emitting apparatus according to a seventh embodiment.

FIG. 8 is a sectional view of a light emitting device package in a light emitting apparatus according to a seventh embodiment.

In descriptions of a light emitting apparatus according to a seventh embodiment, descriptions that duplicate those for the light emitting apparatus according to the first embodiment will be omitted.

Referring to FIG. 8, a light emitting apparatus according to a seventh embodiment, a light emitting device package 20 includes a reflection layer 25 on a top surface of a package body 21. The reflection layer 25 may be formed of a metal or an ink, which has a high reflectivity. The reflection layer 25 may reduce an amount of light absorbed into the package body 21 to improve light emitting efficiency of the light emitting apparatus.

As described above, the embodiments may provide the light emitting apparatus having a novel structure. Also, embodiments may provide the light emitting apparatus including the lens having a novel structure. Also, embodiments may provide the light emitting apparatus having the superior light emitting characteristic in the lateral direction.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lens comprising:
a lens body having a convex top surface comprising a first recessed part at a central portion thereof and a flat surface at a circumference thereof and a flat bottom surface comprising a second recessed part at a central portion thereof; and
a plurality of lens supports on the bottom surface of the lens body,
wherein a ratio of a maximum depth (a) of the first recessed part, from the top surface of the lens body to a bottom surface of the first recessed part, to a maximum thickness (h) of the lens body, from the top surface of the lens body to the bottom surface of the lens body, ranges from about 0.06 to about 0.1.

2. The lens according to claim 1, wherein a ratio of a maximum depth (b) of the second recessed part, from a top surface of the second recessed part to the bottom surface of the lens body, to the maximum thickness (h) of the lens body ranges, from the top surface of the lens body to the bottom surface of the lens body, from about 0.5 to about 0.75.

3. The lens according to claim 1, wherein a ratio of a maximum depth (b) of the second recessed part, from a top surface of the second recessed part to the bottom surface of the lens body, to the maximum depth (a) of the first recessed part, from the top surface of the lens body to a bottom surface of the first recessed part, ranges from about 6.25 to about 10.

4. The lens according to claim 1, wherein a ratio of a maximum width (d) of the second recessed part, the longest distance between two points at a bottom surface of the second recessed part, to a maximum width (j) of the lens body, the longest distance between two points at the bottom surface of the lens body, ranges from about 0.14 to about 0.25.

5. The lens according to claim 1, wherein the maximum thickness (h) of the lens body ranges from about 4 mm to about 5 mm, and wherein the maximum depth (a) of the first recessed part ranges from about 0.3 mm to about 0.4 mm.

6. The lens according to claim 2, wherein the maximum thickness (h) of the lens body ranges from about 4 mm to about 5 mm, and wherein the maximum depth (b) of the second recessed part ranges from about 2.5 mm to about 3 mm.

7. The lens according to claim 3, wherein the maximum depth (a) of the first recessed part ranges from about 0.3 mm to about 0.4 mm, and wherein the maximum depth (b) of the second recessed part ranges from about 2.5 mm to about 3 mm.

8. The lens according to claim 1, wherein the first recessed part and the second recessed part vertically overlap each other.

9. The lens according to claim 1, wherein the plurality of lens supports comprises at least three or more lens supports.

10. The lens according to claim 1, wherein the first recessed part is formed of downwardly concave shape and the second recessed part is formed of upwardly concave shape.

11. A lens comprising:
a lens body having a convex top surface comprising a first recessed part at a central portion thereof and a flat surface at a circumference thereof and a flat bottom surface comprising a second recessed part at a central portion thereof; and
a plurality of lens supports on the bottom surface of the lens body,
wherein a ratio of a maximum depth (b) of the second recessed part, from a top surface of the second recessed part to the bottom surface of the lens body, to the maximum thickness (h) of the lens body ranges, from the top surface of the lens body to the bottom surface of the lens body, from about 0.5 to about 0.75.

12. The lens according to claim 11, wherein a ratio of the maximum depth (b) of the second recessed part, from a top surface of the second recessed part to the bottom surface of the lens body, to a maximum depth (a) of the first recessed part, from the top surface of the lens body to a bottom surface of the first recessed part, ranges from about 6.25 to about 10.

13. The lens according to claim 12, wherein the ratio of a maximum depth (a) of the first recessed part, from the top surface of the lens body to a bottom surface of the first recessed part, to the maximum thickness (h) of the lens body, from the top surface of the lens body to the bottom surface of the lens body, ranges from about 0.06 to about 0.1.

14. The lens according to claim 11, wherein a ratio of a maximum width (d) of the second recessed part, the longest distance between two points at a bottom surface of the second recessed part, to a maximum width (j) of the lens body, the longest distance between two points at the bottom surface of the lens body, ranges from about 0.14 to about 0.25.

15. The lens according to claim 11, wherein the maximum thickness (h) of the lens body ranges from about 4 mm to about 5 mm, and wherein the maximum depth (b) of the second recessed part ranges from about 2.5 mm to about 3 mm.

16. The lens according to claim 12, wherein the maximum depth (a) of the first recessed part ranges from about 0.3 mm to about 0.4 mm, and wherein the maximum depth (b) of the second recessed part ranges from about 2.5 mm to about 3 mm.

17. The lens according to claim 13, wherein the maximum thickness (h) of the lens body ranges from about 4 mm to about 5 mm, and wherein the maximum depth (a) of the first recessed part ranges from about 0.3 mm to about 0.4 mm.

18. The lens according to claim 11, wherein the plurality of lens supports comprises at least three or more lens supports.

19. A lens comprising:
a lens body having a convex top surface comprising a first recessed part at a central portion thereof and a flat surface at a circumference thereof and a flat bottom surface comprising a second recessed part at a central portion thereof; and
a plurality of lens supports on the bottom surface of the lens body,
wherein the first recessed part is formed of downwardly concave shape and the second recessed part is formed of upwardly concave shape,
wherein a ratio of a maximum depth (a) of the first recessed part, from the top surface of the lens body to a bottom surface of the first recessed part, to a maximum thickness (h) of the lens body, from the top surface of the lens body to the bottom surface of the lens body, ranges from about 0.06 to about 0.1,
wherein a ratio of a maximum depth (b) of the second recessed part, from a top surface of the second recessed part to the bottom surface of the lens body, to the maximum thickness (h) of the lens body ranges, from the top surface of the lens body to the bottom surface of the lens body, from about 0.5 to about 0.75, wherein a ratio of the maximum depth (b) of the second recessed part, from a top surface of the second recessed part to the bottom surface of the lens body, to the maximum depth (a) of the first recessed part, from the top surface of the lens body to a bottom surface of the first recessed part, ranges from about 6.25 to about 10, and wherein a ratio of a maximum width (d) of the second recessed part, the longest distance between two points at a bottom surface of the second recessed part, to a maximum width (j) of the lens body, the longest distance between two points at the bottom surface of the lens body, ranges from about 0.14 to about 0.25.

20. The lens according to claim 19, wherein the maximum thickness (h) of the lens body ranges from about 4 mm to about 5 mm, wherein the maximum depth (a) of the first recessed part ranges from about 0.3 mm to about 0.4 mm, wherein the maximum depth (b) of the second recessed part ranges from about 2.5 mm to about 3 mm, and wherein the maximum width (j) of the lens body ranges from about 13 mm to about 19 mm.

\* \* \* \* \*

UNITED STATES PATENT AND TRADEMARK OFFICE
CERTIFICATE OF CORRECTION

| | | |
|---|---|---|
| PATENT NO. | : 8,616,729 B2 | Page 1 of 1 |
| APPLICATION NO. | : 13/719518 | |
| DATED | : December 31, 2013 | |
| INVENTOR(S) | : Gyu Hyeong Bak et al. | |

It is certified that error appears in the above-identified patent and that said Letters Patent is hereby corrected as shown below:

ON THE TITLE PAGE

(12) should read:　　　　　　　Bak, et al.

(71) Applicant<u>s</u> should read:　　Gyu Hyeong Bak, Seoul (KR)
　　　　　　　　　　　　　　　　Sang Won LEE, Seoul (KR)

(72) Inventor<u>s</u> should read:　　Gyu Hyeong Bak, Seoul (KR)
　　　　　　　　　　　　　　　　Sang Won LEE, Seoul (KR)

Signed and Sealed this
Second Day of February, 2016

Michelle K. Lee
*Director of the United States Patent and Trademark Office*